United States Patent
Pajkic et al.

(10) Patent No.: US 11,662,223 B2
(45) Date of Patent: May 30, 2023

(54) OPTOELECTRONIC DEVICE INCLUDING A SHIELDING CAP AND METHODS FOR OPERATING AND FABRICATING AN OPTOELECTRONIC DEVICE

(71) Applicant: OSRAM Opto Semiconductors GmbH, Regensburg (DE)

(72) Inventors: Zeljko Pajkic, Regensburg (DE); Markus Boss, Regensburg (DE); Thomas Kippes, Neumarkt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 654 days.

(21) Appl. No.: 16/662,137

(22) Filed: Oct. 24, 2019

(65) Prior Publication Data
US 2021/0123772 A1  Apr. 29, 2021

(51) Int. Cl.
*G01D 5/14* (2006.01)
*H05K 9/00* (2006.01)
*H01L 25/16* (2023.01)
*H01L 31/0203* (2014.01)
*H01L 31/0232* (2014.01)
(Continued)

(52) U.S. Cl.
CPC ............ *G01D 5/14* (2013.01); *H01L 23/552* (2013.01); *H01L 25/165* (2013.01);
(Continued)

(58) Field of Classification Search
CPC . H01L 31/0203; H01L 25/165; H01L 25/167; H01L 31/02325; H01L 23/552; H01L 33/48; H05K 9/0058; H05K 9/0024; H01S 5/02325; H01S 5/02257; H01S 5/02216; H01S 5/02208; H01S 5/06825; H01S 5/183; H01S 5/0239; G01D 5/14; A61B 1/051; A61B 5/0031; A61B 5/1459; A61B 5/14532; A61B 1/0011; A61B 5/686; A61B 5/0084; A61B 2562/182; A61B 5/0066; A61B 5/14546; G02B 6/4251; G02B 6/122; G02B 6/4277; G02B 6/4257; G02B 6/12004; G09C 1/00; G06Q 20/3821; G06Q 20/223; G06Q 20/3825; H04L 63/0428; H04L 9/3239; H04L 63/0442; H04L 9/0861; H04L 9/3247; H04L 9/3268; H04L 9/3263; H04L 63/0823; H04L 9/30; H04L 9/14; H04L 9/0643; H04L 9/3278; G06F 21/57; G06F 21/71; G06F 21/73; G06F 21/87; G06F 21/335; G06F 21/45; G01F 1/588; G01F 1/60; G01N 27/045; G01N 27/08
(Continued)

(56) References Cited

U.S. PATENT DOCUMENTS

2003/0123783 A1\* 7/2003 Miyata .................... G02F 1/116
                                                                              385/39
2009/0001553 A1\* 1/2009 Pahl ...................... B81B 7/0064
                                                                              438/126
(Continued)

*Primary Examiner* — Mouloucoulaye Inoussa
(74) *Attorney, Agent, or Firm* — Viering, Jentschura & Partner MbB

(57) ABSTRACT

An optoelectronic device comprises a substrate, an optoelectronic element mounted on the substrate, a shielding cap providing electromagnetic shielding, at least one optical element attached to the shielding cap, and a detection element configured to detect if the shielding cap is mounted on the substrate.

15 Claims, 2 Drawing Sheets

(51) Int. Cl.
*H01L 23/552* (2006.01)
*H01S 5/02257* (2021.01)
*H01S 5/02325* (2021.01)
*H01S 5/02216* (2021.01)
*H01S 5/183* (2006.01)

(52) U.S. Cl.
CPC ........ *H01L 25/167* (2013.01); *H01L 31/0203* (2013.01); *H01L 31/02325* (2013.01); *H01S 5/02257* (2021.01); *H01S 5/02325* (2021.01); *H05K 9/0024* (2013.01); *H01S 5/02216* (2013.01); *H01S 5/183* (2013.01)

(58) Field of Classification Search
USPC ................ 257/431, 777, E31.001, E23.141; 713/194
See application file for complete search history.

(56) References Cited

U.S. PATENT DOCUMENTS

| | | | | |
|---|---|---|---|---|
| 2009/0091904 A1* | 4/2009 | Hatanaka | ............ | H03H 9/0542 361/764 |
| 2009/0302439 A1* | 12/2009 | Pagaila | ............... | H01L 23/3121 257/E23.18 |
| 2012/0069529 A1* | 3/2012 | Chen | ...................... | H01L 23/552 361/729 |
| 2012/0228751 A1* | 9/2012 | Song | ..................... | H01L 23/552 438/109 |
| 2013/0221528 A1* | 8/2013 | Cheng | ..................... | H01L 23/66 438/643 |
| 2014/0183671 A1* | 7/2014 | Kuratani | ............... | B81B 7/0064 257/416 |
| 2016/0123816 A1* | 5/2016 | Pei | ............................ | G01J 5/12 374/121 |
| 2016/0163650 A1* | 6/2016 | Gao | ..................... | H01L 23/3128 438/126 |
| 2017/0317002 A1* | 11/2017 | Kitahara | ............. | H01L 23/3121 |
| 2018/0166387 A1* | 6/2018 | Matsui | .................. | H01L 23/535 |
| 2018/0233458 A1* | 8/2018 | Jeong | .................... | H01L 23/552 |
| 2018/0248518 A1* | 8/2018 | Nicholls | ................... | G02F 2/02 |
| 2018/0284563 A1* | 10/2018 | Register | ............... | G10K 11/178 |
| 2020/0251618 A1* | 8/2020 | Tsai | ..................... | H01L 33/382 |
| 2020/0321293 A1* | 10/2020 | Kim | ..................... | H01Q 1/2283 |
| 2021/0233865 A1* | 7/2021 | Tarui | .................... | H01Q 1/2283 |

\* cited by examiner

OPTOELECTRONIC DEVICE INCLUDING A SHIELDING CAP AND METHODS FOR OPERATING AND FABRICATING AN OPTOELECTRONIC DEVICE

TECHNICAL FIELD

The invention concerns an optoelectronic device including a shielding cap, a method for operating an optoelectronic device and a method for fabricating an optoelectronic device.

BACKGROUND

Optoelectronic devices can contain elements producing electromagnetic radiation, in particular high frequency electromagnetic radiation, which is also called radio frequency radiation. In order to protect other devices from the emitted electromagnetic radiation, electromagnetic shielding can reduce or block the electromagnetic field with barriers made of electrically conductive materials.

DETAILED DESCRIPTION

Figure 1:
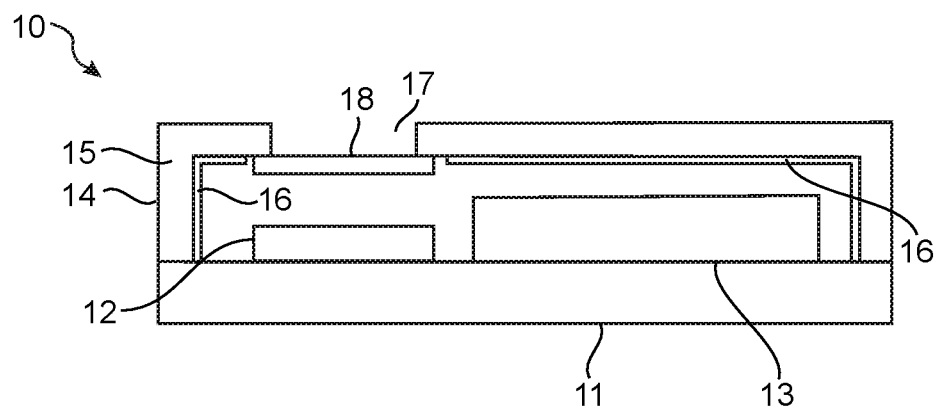
FIG. 1 depicts a schematic representation of an exemplary embodiment of an optoelectronic device including a substrate, an optoelectronic element, a further element, a shielding cap and an optical element.

It is an underlying object of the invention to provide an optoelectronic device that allows to shield electromagnetic radiation and can be manufactured more economically and has a more compact size than conventional devices.

An object underlying the invention is satisfied by an optoelectronic device having the features of the independent claim 1. Further, objects underlying the invention are satisfied by a method for operating an optoelectronic device having the features of independent claim 10 and a method for fabricating an optoelectronic device having the features of independent claim 12. Advantageous further developments and aspects of the invention are set forth in the dependent claims.

In a first aspect of the instant application an optoelectronic device, in particular a light emitting or light detecting optoelectronic device, is provided. The optoelectronic device comprises a substrate and an optoelectronic element mounted on the substrate. As the optoelectronic element and/or another element mounted on the substrate emit electromagnetic radiation, in particular high frequency electromagnetic radiation, during operation, a shielding cap is mounted on the substrate that provides electromagnetic shielding in order to block or reduce the electromagnetic radiation. In particular, the shielding cap covers the element(s) of the optoelectronic device producing electromagnetic radiation. At least one optical element is attached to the shielding cap.

Further, the optoelectronic device comprises a detection element that is configured to detect whether the shielding cap is mounted on the substrate. The detection element may be configured such that if it detects that the shielding cap is not mounted on the substrate or is not mounted correctly on the substrate, then the detection element prevents the optoelectronic device from operating and, in particular, prevents the optoelectronic element from emitting or detecting light. Only if the shielding cap is mounted on the substrate, the detection element allows the optoelectronic device to operate and, in particular, the optoelectronic element to emit or detect light.

The detection element thus prevents the optoelectronic device from generating electromagnetic radiation when the shielding cap is not properly mounted on the substrate and shields the elements generating electromagnetic radiation.

The substrate may be a printed circuit board, PCB, a ceramic based substrate, a quad flat no leads package, QFN, or any other suitable substrate.

The optoelectronic element may comprise a light emitting diode, LED, or a laser diode, for example a vertical-cavity surface-emitting laser, VCSEL, or any other suitable light emitting element. The optoelectronic element may emit light of a certain wavelength or within a certain range of wavelengths, for example, visible light or infrared, IR, light or ultraviolet, UV, light.

Further, the optoelectronic element may be configured to detect light. For example, the optoelectronic element may be a photodiode.

The optoelectronic element may comprise an integrated circuit, IC, and, in particular, a semiconductor chip or a packaged semiconductor chip.

The optoelectronic device may comprise several optoelectronic elements emitting and/or detecting light as described above.

The at least one optical element may comprise, for example, a lens, a Fresnel optical system, a diffractive optical element, a meta optical element, a micro lens array or a transparent window. Several of these optical elements may be integrated into the shielding cap. The optical element(s) may be arranged in the shielding cap such that the light emitted from or detected by the optoelectronic element passes through the optical element(s).

An equipment that contains the optoelectronic device does not require an electromagnetic shielding since the optoelectronic device itself includes the shielding cap for shielding electromagnetic radiation generated by the optoelectronic element and/or any other element mounted on the substrate. This allows to reduce costs for manufacturing the equipment and also reduces the size of the equipment.

The detection element may further be configured to detect if the at least one optical element is attached to the shielding cap. The shielding cap may have at least one opening which is covered by the at least one optical element. The detection element may be configured such that it prevents the optoelectronic device from operating and, in particular, prevents the optoelectronic element from emitting light if the detection element detects that the at least one optical element is not attached to the shielding cap. Only if the at least one optical element is attached to the shielding cap, the detection element allows the optoelectronic device to operate and, in particular, the optoelectronic element to emit light. This prevents the optoelectronic element from emitting light in case the at least one optical element is not arranged in the light's beam path.

The shielding cap may comprise a body and at least one electrically conductive layer that is deposited on the body and is configured to shield electromagnetic radiation.

The body of the shielding cap may be manufactured from an electrically insulating material providing mechanical hold. The body may be manufactured, for example, from polymers, ceramics, glass or composite materials. The body may have a base wall and several side walls, for example four side walls, extending from the base wall. Opposite the base wall the body may have an opening defined by the side walls. The shielding cap is mounted on the substrate such that the side walls are coupled to the substrate. The shielding cap may be attached to the substrate by gluing, soldering, sintering or any other suitable method as described in detail further below.

The body of the shielding cap may be fabricated by a molding technique or any other suitable technique. It is also possible that the at least one optical element is an integral part of the shielding cap. The at least one optical element can be integrated in the shielding cap by using a multicomponent fabrication method, for example, multicomponent injection molding, insert molding, compression molding or a combination thereof, such as injection molding and replication.

The at least one electrically conductive layer may be deposited on one or more inner surfaces of the body or one or more outer surfaces of the body. The at least one electrically conductive layer may cover the base wall and one or more or all of the side walls at least partially.

The at least one electrically conductive layer may comprise at least one of the metals gold, silver, copper, nickel and aluminum. Further, the at least one electrically conductive layer may comprise an electrically conductive polymer or a composite material including a polymer matrix and an electrically conductive filling material. The at least one electrically conductive layer may further include a stack of several electrically conductive layers, for example, a gold layer and a nickel layer deposited on the gold layer or a copper layer and a nickel layer deposited on the copper layer.

The electrically conductive layers deposited on the body of the shielding cap may have a total thickness in the range from 20 µm to 200 µm. It is also possible that the thickness of the electrically conductive layers is outside of the aforementioned range.

Molded interconnect devices, MID, technology may be used to fabricate the body together with the at least one electrically conductive layer.

The shielding cap may comprise at least one ground contact pad that is electrically coupled to the at least one electrically conductive layer. When the shielding cap is correctly mounted on the substrate, the at least one ground contact pad is electrically coupled to a contact pad of the substrate that is connected to ground or a reference potential. This ensures that the at least one electrically conductive layer providing shielding against electromagnetic radiation is coupled to ground or the reference potential during operation of the optoelectronic device.

The at least one ground contact pad may be attached to the substrate by using an electrically conductive adhesive, soldering, sintering or any other suitable method. In case of using gluing, the thermal expansion coefficient of the electrically conductive adhesive may be similar to the thermal expansion coefficients of the substrate and the shielding cap.

The optoelectronic device may further comprise at least one circuit with a first portion of the circuit being located on the substrate and a second portion of the circuit being located on the shielding cap. The first and second portions of the circuit are arranged such that when the shielding cap is properly mounted on the substrate, the circuit is closed. Otherwise the circuit is open. The detection element is configured to detect if the circuit is closed and the shielding cap is thus properly mounted on the substrate. In this case the detection element allows to operate the optoelectronic device.

In addition, the circuit may comprise a third portion that is located on the at least one optical element. Only if the at least one optical element is correctly attached to the shielding cap, in particular in the correct orientation, the third portion is connected to the second portion of the circuit. Thus, only in this case the circuit is closed, which is detected by the detection element. Otherwise, the circuit is not closed and the detection prevents the optoelectronic device from operating.

It is also possible that the detection circuit comprises two separate circuits, wherein one of the two circuits is closed only when the shielding cap is properly mounted on the substrate and the other one is closed only when the at least one optical element is attached, in particular in the correct orientation, to the shielding cap.

Further, the at least one electrically conductive layer, which provides shielding against electromagnetic radiation, may form a part of the circuit used by the detection element to detect if the shielding cap and/or the at least one optical element are in the correct positions.

Alternatively, the circuit may comprise at least one conductor track that is deposited on the body, in particular a single conductor track or two conductor tracks. The at least one conductor track is not a part of at least one electrically conductive layer, which provides shielding against electromagnetic radiation, and is electrically insulated from the at least one electrically conductive layer.

The optoelectronic device may further comprise at least one driver element that is configured to drive the optoelectronic element and is mounted on the substrate. The at least one driver element may, for example, drive a VSCEL used as the optoelectronic element. The at least one driver element may generate electromagnetic radiation that is shielded by the shielding cap during the operation of the optoelectronic device.

In a second aspect of the instant application a method for operating an optoelectronic device is provided. The method comprises the following steps: providing an optoelectronic device comprising a substrate and an optoelectronic element mounted on the substrate, and detecting if a shielding cap that provides electromagnetic shielding and comprises at least one optical element is mounted on the substrate.

In a third aspect of the instant application a method for fabricating an optoelectronic device is provided. The method comprises the following steps: providing a substrate, mounting an optoelectronic element on the substrate, mounting a shielding cap on the substrate, wherein the shielding cap provides electromagnetic shielding and comprises at least one optical element, and detecting if the shielding cap is mounted on the substrate.

The methods according to the second and third aspects may comprise the embodiments disclosed above in connection with the optoelectronic device according to the first aspect.

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures. There are shown in the drawings:

FIG. 1 illustrates a schematic representation of a cross-section of an optoelectronic device 10. In the following, the structure as well as the operation of the optoelectronic device 10 are described. Further, a method for fabricating the optoelectronic device 10 is described.

The optoelectronic device 10 includes a substrate 11 and an optoelectronic element 12 as well as a further element 13, which are both mounted on the substrate 11. The optoelectronic element 12 may, for example, be a semiconductor laser diode, such as a VCSEL, emitting a laser beam. The element 13 may include an integrated circuit driving the optoelectronic element 12. Both the optoelectronic element 12 and the element 13 produce high frequency electromagnetic radiation during operation.

In order to shield the electromagnetic radiation, a shielding cap 14 is mounted on the substrate 10, which covers the optoelectronic element 12 and the element 13.

The shielding cap 14 includes a body 15 made of an electrically insulating material and one or more metal layer(s) 16 deposited on the interior of the body 15. Further, the shielding cap 14 includes an opening 17 above the optoelectronic element 12. The opening 17 is covered by an optical element 18 such that a laser beam emitted by the optoelectronic element 12 passes through the optical element 18 before it leaves the optoelectronic device 10.

Further, the optoelectronic device 10 comprises a detection element that is configured to detect whether the shielding cap 14 is mounted on the substrate 11 and the optical element 18 is attached to the shielding cap 14. The detection element is integrated in the element 13. The detection element operates such that the optoelectronic device 10 is prevented from operating and the optoelectronic element 12 is prevented from emitting a laser beam if the detection element detects that the shielding cap 14 is not mounted on the substrate 11 or the optical element 18 is not attached to the shielding cap 14.

Figure 2A:
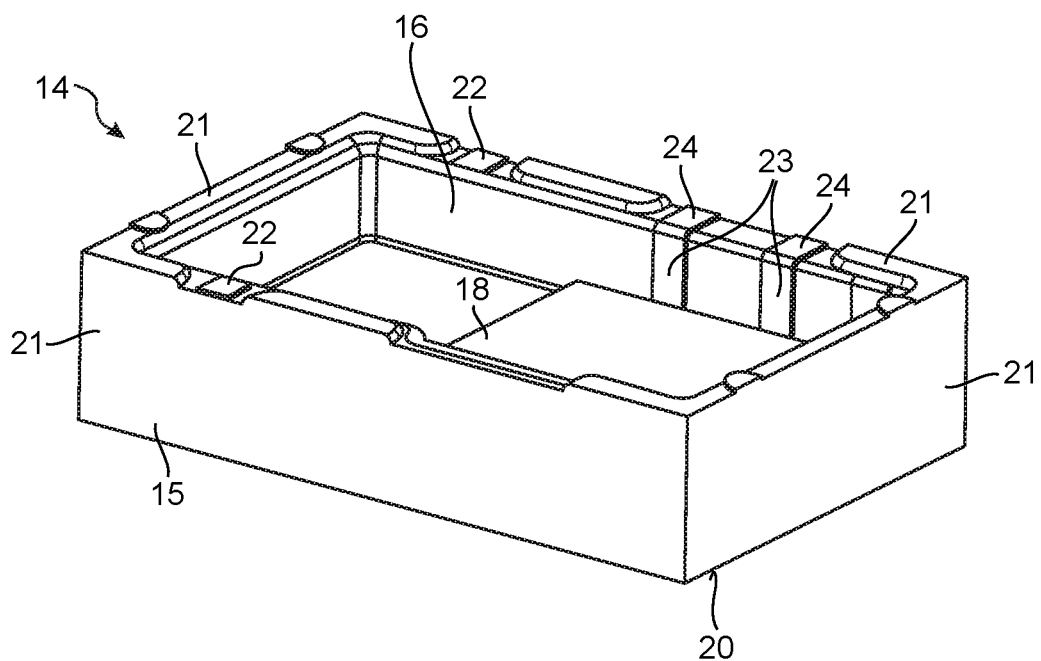
FIGS. 2A to 2D depict schematic representations of an exemplary embodiment of a shielding cap with an optical element from various perspectives.
Figure 2B:
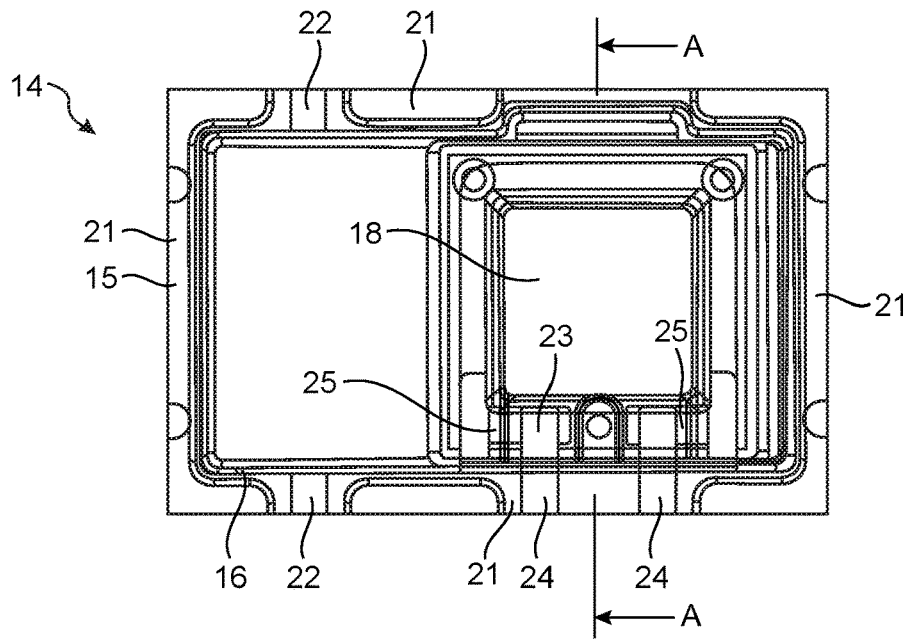
Figure 2C:
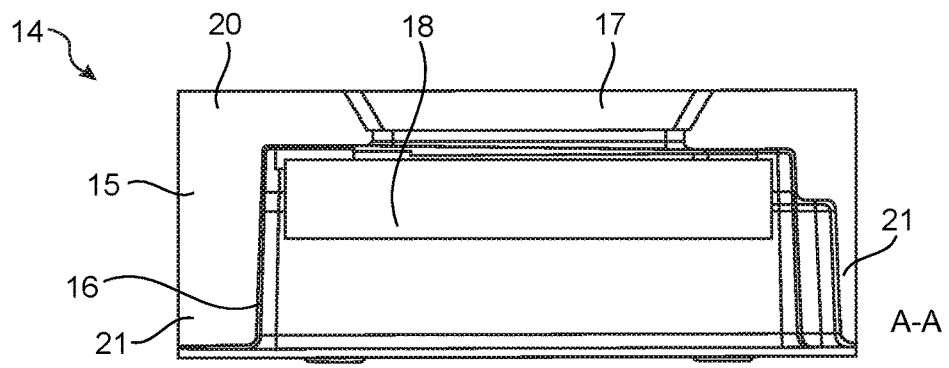
Figure 2D:
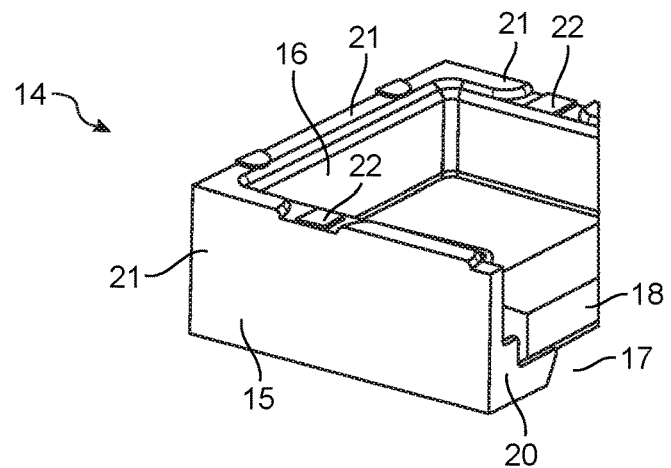

FIGS. 2A to 2D illustrate an embodiment of the shielding cap 14 in greater detail. FIG. 2A shows a three dimensional view of the shielding cap 14. FIG. 2B illustrates a bottom view of the shielding cap 14 and FIG. 2C illustrates a cross-section of the shielding cap 14 along the line A-A shown in FIG. 2B. Finally, FIG. 2D shows a three dimensional cutaway view of the shielding cap 14.

The body 15 of the shielding cap 14 has a base wall 20 and four side walls 21 extending from the base wall 20. The side walls 21 define an opening for mounting the shielding cap 14 onto the substrate 11 such that the optoelectronic element 12 and the element 13 are covered by the shielding cap 14. The metal layers 16 cover the base wall 20 and the side walls 21 at least partially.

Two ground contact pads 22 are deposited on the surfaces of the side walls 21 facing the substrate 11. The ground contact pads 22 are connected to the metal layers 16. When the shielding cap 14 is mounted on the substrate 11, the ground contact pads 22 are electrically coupled to contact pads of the substrate 11 that are connected to ground or a reference potential in order to ensure that the metal layers 16 providing shielding against electromagnetic radiation are coupled to ground or the reference potential.

Further, two conductor tracks 23 are deposited on the inner surface of one of the side walls 21. At the one end the conductor tracks 23 are connected to external contact pads 24 and at the other end the conductor tracks 23 are coupled to a conductor track 25 deposited on the optical element 18. The conductor track 25 is arranged such that it electrically couples the two conductor tracks 23 with each other. Further, there are conductor tracks arranged on the substrate 11, which are electrically coupled to the conductor tracks 23 via the external contact pads 24 if the shielding cap 14 is correctly mounted on the substrate 11. Thus, a circuit comprising the conductor tracks 23 and 25 as well as the conductor tracks on the substrate 11 is closed when the shielding cap 14 is mounted on the substrate 11 and the optical element 18 is attached to the shielding cap 14. The detection element, which is integrated in the element 13, detects whether the circuit is closed or open and controls the operation of the optoelectronic element 11 accordingly.

When mounting the shielding cap 14 on the substrate 11, the ground contact pads 22 and the external contact pads 24 are attached to respective contact pads of the substrate 11 by using, for example, electrically conductive adhesive, soldering or sintering.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

In Example 1, an optoelectronic device (10) is disclosed, comprising: a substrate (11), an optoelectronic element (12) mounted on the substrate (11), a shielding cap (14) providing electromagnetic shielding, at least one optical element (18) attached to the shielding cap (14), and a detection element (13) configured to detect if the shielding cap (14) is mounted on the substrate (11).

In Example 2, the optoelectronic device (10) of Example 1 is disclosed, wherein the detection element (13) is further configured to detect if the at least one optical element (18) is attached to the shielding cap (14).

In Example 3, the optoelectronic device (10) of Example 1 or 2 is disclosed, wherein the shielding cap (14) comprises a body (15) and at least one electrically conductive layer (16) deposited on the body (15) and configured to shield electromagnetic radiation.

In Example 4, the optoelectronic device (10) of Example 3 is disclosed, wherein the shielding cap (14) comprises at least one ground contact pad (22) electrically coupled to the at least one electrically conductive layer (16) and configured to be electrically coupled to the substrate (11) when the shielding cap (14) is mounted on the substrate (11).

In Example 5, the optoelectronic device (10) of Example 2 is disclosed, further comprising at least one circuit with a first portion of the circuit being located on the substrate (11) and a second portion of the circuit being located on the shielding cap (14), wherein the detection element (13) is configured to detect if the circuit is closed.

In Example 6, the optoelectronic device (10) of Example 5 is disclosed, wherein the circuit comprises a third portion being located on the at least one optical element (18).

In Example 7, the optoelectronic device (10) of Example 5 or 6 is disclosed, wherein the shielding cap (14) comprises a body (15) and at least one electrically conductive layer (16) deposited on the body (15) and configured to shield electromagnetic radiation, and wherein the at least one electrically conductive layer (16) is part of the circuit.

In Example 8, the optoelectronic device (10) of Example 5 or 6 is disclosed, wherein the shielding cap (14) comprises a body (15) and at least one electrically conductive layer (16) deposited on the body (15) and configured to shield electromagnetic radiation, and wherein the circuit comprises at least one conductor track (23) that is deposited on the body (15) and is electrically insulated from the at least one electrically conductive layer (16).

In Example 9, the optoelectronic device (10) of Example 1 is disclosed, further comprising a driver element (13) configured to drive the optoelectronic element (12) and mounted on the substrate (11).

In Example 10, a method for operating an optoelectronic device (10) is disclosed, comprising: providing an optoelectronic device (10) comprising a substrate (11) and an optoelectronic element (12) mounted on the substrate (11), and detecting if a shielding cap (14) that provides electromagnetic shielding and comprises at least one optical element (18) is mounted on the substrate (11).

In Example 11, the method of Example 10 is disclosed, wherein it is further detected if the at least one optical element (18) is attached to the shielding cap (14).

In Example 12, a method for fabricating an optoelectronic device (10) is disclosed, comprising: providing a substrate (11), mounting an optoelectronic element (12) on the substrate (11), mounting a shielding cap (14) on the substrate (11), wherein the shielding cap (11) provides electromagnetic shielding and comprises at least one optical element (18), and detecting if the shielding cap (14) is mounted on the substrate (11).

In Example 13, the method of Example 12 is disclosed, wherein the shielding cap (14) is mounted on the substrate (11) by using gluing, soldering and/or sintering.

LIST OF REFERENCE SIGNS 10 optoelectronic device
11 substrate
12 optoelectronic element
13 element
14 shielding cap
15 body
16 metal layer
17 opening
18 optical element
20 base wall
21 side wall
22 ground contact pad
23 conductor track
24 external contact pad
25 conductor track

What is claimed is:

1. An optoelectronic device, comprising:
a substrate, comprising a first electrical contact, a second electrical contact, and a ground contact;
an optoelectronic element mounted on the substrate;
a shielding cap providing electromagnetic shielding, the shielding cap comprising:
a body; and
at least one electrically conductive layer deposited on the body and configured to shield electromagnetic radiation;
wherein when the shielding cap is mounted on the substrate, the at least one electrically conductive layer is connected to the ground contact; and
wherein the shielding cap further comprises a third electrical contact and a fourth electrical contact, isolated from the at least one electrically conductive layer;
at least one optical element, comprising an optical lens, attached to the shielding cap, wherein the at least one optical element comprises an electrically conductive path that electrically conductively connects the third electrical contact and the fourth electrical contact when the at least one optical element is attached to the shielding cap and electrically disconnects the third electrical contact and the fourth electrical contact when the at least one optical element is not attached to the shielding cap; and
a detection element configured to detect if the shielding cap is mounted on the substrate;
wherein, when the shielding cap is mounted on the substrate, the first electrical contact is electrically connected to the third electrical contact and the second electrical contact is electrically connected to the fourth electrical contact.

2. The optoelectronic device as claimed in claim 1, wherein the detection element is further configured to detect if the at least one optical element is attached to the shielding cap.

3. The optoelectronic device as claimed in claim 1, further comprising at least one circuit with a first portion of the circuit being located on the substrate and a second portion of the circuit being located on the shielding cap, wherein the detection element is configured to detect if the circuit is closed.

4. The optoelectronic device as claimed in claim 3, wherein the circuit comprises a third portion being located on the at least one optical element.

5. The optoelectronic device as claimed in claim 3, wherein the shielding cap comprises a body and at least one electrically conductive layer deposited on the body and configured to shield electromagnetic radiation, and wherein the at least one electrically conductive layer is part of the circuit.

6. The optoelectronic device as claimed in claim 3, wherein the shielding cap comprises a body and at least one electrically conductive layer deposited on the body and configured to shield electromagnetic radiation, and wherein the circuit comprises at least one conductor track that is deposited on the body and is electrically insulated from the at least one electrically conductive layer.

7. The optoelectronic device as claimed in claim 1, further comprising a driver element configured to drive the optoelectronic element and mounted on the substrate.

8. A method for operating an optoelectronic device, comprising:
providing an optoelectronic device comprising a substrate and an optoelectronic element mounted on the substrate, and
detecting if a shielding cap that provides electromagnetic shielding and comprises at least one optical element is mounted on the substrate.

9. The method as claimed in claim 8, wherein it is further detected if the at least one optical element is attached to the shielding cap.

10. A method for fabricating an optoelectronic device, comprising:
providing a substrate, comprising a first electrical contact, a second electrical contact, and a ground contact;
mounting an optoelectronic element on the substrate,
mounting a shielding cap on the substrate, wherein the shielding cap comprises a body; and at least one electrically conductive layer deposited on the body and configured to shield electromagnetic radiation;
wherein when the shielding cap is mounted on the substrate, the at least one electrically conductive layer is connected to the ground contact and wherein the shielding cap further comprises a third electrical contact and a fourth electrical contact, isolated from the at least one electrically conductive layer;
wherein the shielding cap provides electromagnetic shielding and comprises at least one optical element, wherein the at least one optical element comprises a lens and an electrically conductive path that electrically conductively connects the third electrical contact and the fourth electrical contact when the at least one optical element is attached to the shielding cap and electrically disconnects the third electrical contact and the fourth electrical contact when the at least one optical element is not attached to the shielding cap; and detecting if the shielding cap is mounted on the substrate;

wherein, when the shielding cap is mounted on the substrate, the first electrical contact is electrically connected to the third electrical contact and the second electrical contact is electrically connected to the fourth electrical contact.

11. The method as claimed in claim 10, wherein the shielding cap is mounted on the substrate by using gluing, soldering and/or sintering.

12. The optoelectronic device as claimed in claim 1, wherein the body of the shielding cap is composed of an electrically insulating material.

13. The optoelectronic device as claimed in claim 12, wherein the body of the shielding cap comprises a base wall and a plurality of side walls; wherein the electrically conductive layer comprises a layer deposited on the base wall and the plurality of the side walls.

14. The optoelectronic device as claimed in claim 1, wherein the optical element is transparent.

15. The optoelectronic device as claimed in claim 1, further comprising a driver element, mounted on the substrate and configured to drive the optoelectronic element; wherein the optoelectronic device is configured to apply a working voltage to the driving element via the first electrical contact, the second electrical contact, the third, electrical contact, and the fourth electrical contact when the shielding cap is mounted to the substrate.

* * * * *